(12) United States Patent
Chow

(10) Patent No.: US 7,154,260 B2
(45) Date of Patent: Dec. 26, 2006

(54) PRECISION MEASUREMENT UNIT HAVING VOLTAGE AND/OR CURRENT CLAMP POWER DOWN UPON SETTING REVERSAL

(75) Inventor: Chung-Kai Chow, Austin, TX (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 10/969,559

(22) Filed: Oct. 19, 2004

(65) Prior Publication Data
US 2006/0082359 A1   Apr. 20, 2006

Related U.S. Application Data

(63) Continuation-in-part of application No. 10/371,521, filed on Feb. 21, 2003, now Pat. No. 6,828,775.

(51) Int. Cl.
*G01R 31/00* (2006.01)
(52) U.S. Cl. .................................. 324/158.1; 324/73.1
(58) Field of Classification Search .............. 324/73.1, 324/763–765, 756, 158.1; 327/334, 541, 327/404; 714/724, 733, 736; 702/117–120
See application file for complete search history.

(56) References Cited

U.S. PATENT DOCUMENTS

| | | | | |
|---|---|---|---|---|
| 6,028,438 A | * | 2/2000 | Gillette | 324/765 |
| 2004/0130344 A1 | * | 7/2004 | Rohrbaugh et al. | 324/763 |
| 2004/0151032 A1 | * | 8/2004 | Polansky et al. | 365/189.05 |
| 2004/0164724 A1 | * | 8/2004 | Chow et al. | 324/158.1 |

* cited by examiner

*Primary Examiner*—Vinh P. Nguyen
(74) *Attorney, Agent, or Firm*—O'Melveny & Myers LLP

(57) ABSTRACT

A precision measurement unit (PMU) includes a force amplifier selectively providing either a forcing voltage or a forcing current to a device under test via an output force terminal. A low limit voltage clamp and a high limit voltage clamp are operatively coupled to the output force terminal. The low and high limit voltage clamps are each responsive to user programming to define respective low and high voltage limits at the output force terminal. Upon detection of a reversal of said user programming, the operation of the low and high limit voltage clamps is disabled. More particularly, a comparator is adapted to compare the low and high voltage limits and provide a corresponding disabling signal if the high voltage limit is lower than the low voltage limit.

13 Claims, 4 Drawing Sheets

PRECISION MEASUREMENT UNIT HAVING VOLTAGE AND/OR CURRENT CLAMP POWER DOWN UPON SETTING REVERSAL

RELATED APPLICATION DATA

This patent application claims priority under 35 U.S.C. § 120 as a continuation-in-part of U.S. patent application Ser. No. 10/371,521, for HIGH-IMPEDANCE MODE FOR PRECISION MEASUREMENT UNIT, filed Feb. 21, 2003 now U.S. Pat. No. 6,828,775.

BACKGROUND OF THE INVENTION

1. Field of the Invention

The invention relates to the field of automatic test equipment for semiconductor devices, and more particularly to a precision measurement unit having clamps that limit voltage or current spikes to a device under test and that protects against inadvertent user reversal of the clamp range settings.

2. Description of Related Art

As part of the manufacturing process, semiconductor devices are subjected to various tests in order to identify faults. This testing can occur at multiple points in the manufacturing process, including testing done before packaging and testing done after packaging. Manufacturer testing of semiconductors is often performed using equipment referred to as automatic test equipment, or ATE. An ATE system can be used in a wide variety of applications, including the identification of defective semiconductors and the sampling of parts for quality control.

Automatic test equipment further includes specialized semiconductor devices known as precision measurement units, or PMUs, that are used to force a signal to a device under test (DUT) at a particular current or voltage, and/or to sense the voltage or current from the DUT in response to the forcing signal. An example of a per-pin PMU device is the Edge4707 part manufactured by Semtech Corporation. This device has four channels that can each be independently configured to force voltage or current to a DUT and to sense voltage or current from the DUT. ATE systems with a large number of individually controllable pins can be constructed using multiple PMUs and the PMUs can have multiple ranges of operation. In the case of the Edge4707, there are four current ranges available in the force current mode, with each being selectable using an input selection control and external resistors.

It is known to include clamps in the PMU device that limit the voltage or current spikes that might result from changing the current range or changing the operating mode of the PMU. For example, the high limit voltage (HLV) and low limit voltage (LLV) are limit ranges of the clamps that may be programmed by the user for a particular application. But, if the user inadvertently reverses the programming of the clamp HLV and LLV parameters, i.e., programming the HLV voltage or current spikes can pass to the DUT and/or PMU, which could thereby damage the parts. It would therefore be desirable to provide a PMU device having clamps that limit voltage or current spikes to a DUT and that protects against inadvertent reversal of the clamp range settings.

SUMMARY OF THE INVENTION

The present invention overcomes the drawbacks of the prior art by providing a precision measurement unity (PMU) that protects against inadvertent reversal of the clamp range settings.

In accordance with an embodiment of the invention, the PMU includes a force amplifier selectively providing either a forcing voltage or a forcing current to a device under test via an output force terminal. A low limit voltage clamp and a high limit voltage clamp are operatively coupled to the output force terminal. The low and high limit voltage clamps are each responsive to user programming to define respective low and high voltage limits at the output force terminal. Upon detection of a reversal of said user programming, the operation of the low and high limit voltage clamps is disabled. More particularly, a comparator is adapted to compare the low and high voltage limits and provide a corresponding disabling signal if the high voltage limit is lower than the low voltage limit.

A more complete understanding of the precision measurement unit having voltage and/or current clamps that power down upon inadvertent reversal of the clamp range settings will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION OF THE PREFERRED EMBODIMENT

The present invention is directed to a PMU device having clamps that limit voltage or current spikes to a DUT and that protects against inadvertent reversal of the clamp range settings. It should be appreciated that like element numerals are used to describe like elements illustrated in one or more of the figures.

Figure 1:
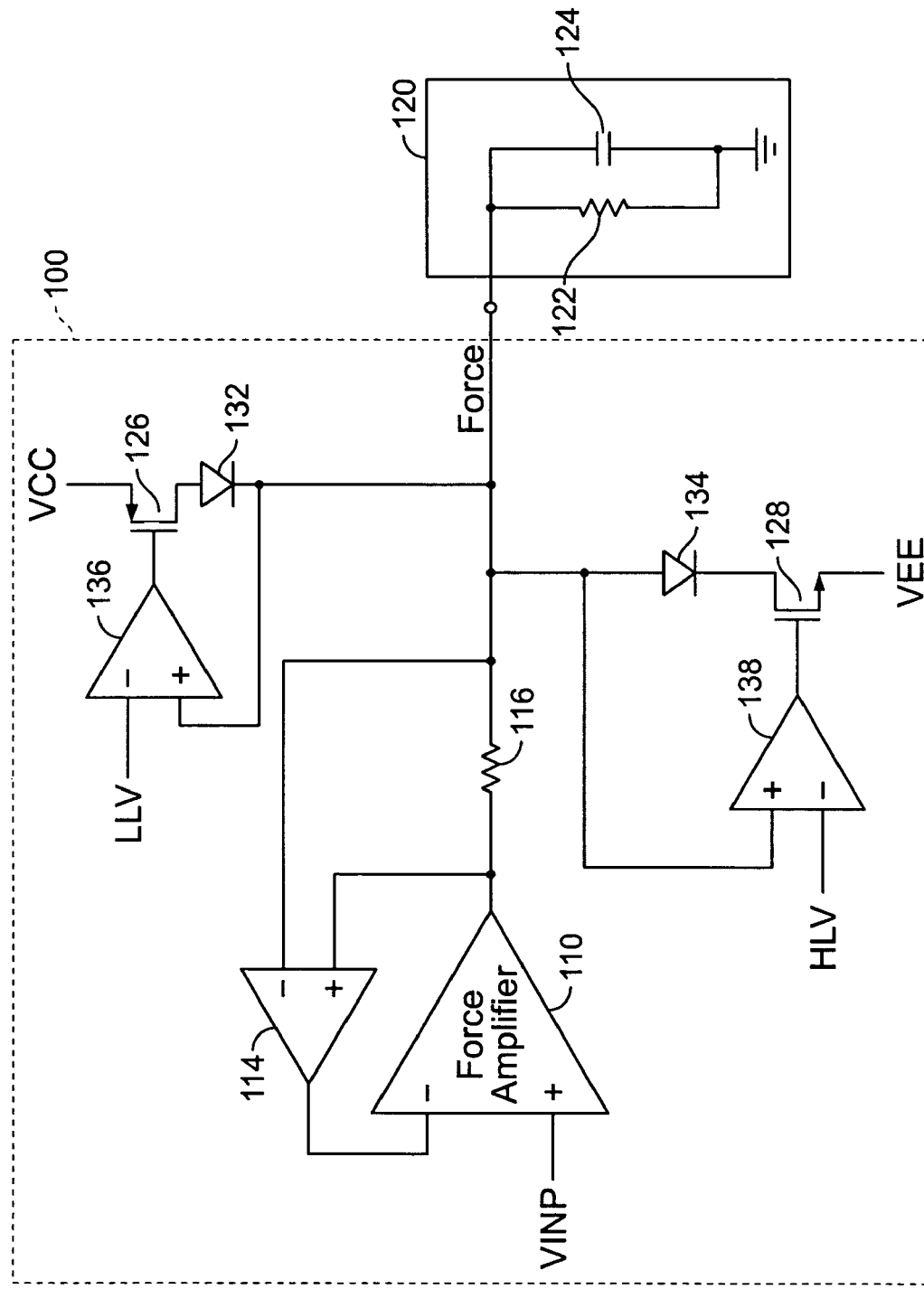
FIG. 1 is a schematic drawing of a prior art precision measurement unit (PMU) coupled to a device under test (DUT)

FIG. 1 illustrates a prior art precision measurement unit (PMU) 100 coupled to a DUT 120. The DUT 120 is illustrated as having a characteristic resistance 122 and capacitance 124. The PMU 100 includes a force amplifier 110 having two inputs and producing a force output. The force output is an analog output signal that either forces a current or forces a voltage, depending upon which operating mode of the PMU is selected. A current sense resistor 116 is connected in series with the force output. A current sense amplifier 114 has input terminals connected to either end of the current sense resistor 116 in order to sense the voltage drop across the current sense resistor and produce an output voltage that corresponds to the voltage drop. The non-inverting (+) input of the force amplifier 110 is coupled to analog input voltage (VINP) that forces the output voltage, and the inverting (−) input of the force amplifier is coupled to an output of current sense amplifier 114. The current sense amplifier 114 regulates the force amplifier 110 so that the current forced to the DUT 120 maps directly to the analog input voltage VINP.

The output of the force amplifier 110 is further coupled to the drain of pull-up transistor 126 through diode 132 and to the drain of pull-down transistor 128 through diode 134. The source of the pull-up transistor 126 is coupled to a positive supply voltage (VCC) and the source of the pull-down transistor 128 is coupled to a negative supply voltage (VEE). The gate of the pull-up transistor 126 is driven by a positive clamp driver 136, having an inverting input adapted to receive the programmable low limit voltage (LLV) signal and a non-inverting input coupled to the force output. Likewise, the gate of the pull-down transistor 128 is driven by a negative clamp driver 138, having an inverting input adapted to receive the programmable high limit voltage (HLV) signal and a non-inverting input coupled to the force output. If the force output falls to the low limit voltage LLV, the positive clamp driver 136 drives the pull-up transistor 126 to conduct and thereby pull the force output back toward the positive supply voltage VCC. Conversely, if the force output rises to the high limit voltage HLV, the negative clamp driver 138 drives the pull-down transistor 128 to conduct and thereby pull the force output back toward the negative supply voltage VEE.

By way of example, the PMU may be programmed with HLV=3 v, LLV=0 v. If the force output rises to 4 v, then the negative clamp driver 138 causes the pull-down transistor 128 to pull the force output back down to 3 v. If the force output falls to −1 v, then the positive clamp driver 136 causes the pull-up transistor 126 to pull the force output back up to 0 v. Accordingly, the force output is regulated to stay within the range defined by the programming of the HLV and LLV values.

It should be appreciated that the proper operation of the positive and negative clamp drivers 136, 138 is dependent upon accurate programming of the high and low limit voltages HLV, LLV. In the event that the programming of these two parameters were inadvertently reversed, the clamps would fail to operate as intended. Using the above example, an error in the programming of the PMU can cause the programming to set LLV=3 v and HLV=0 V. If the force voltage is 1.5 v, then both the negative clamp driver 138 and the positive clamp driver 136 will be trying to correct the "error" condition at the same time. The negative clamp driver 138 would drive the pull-down transistor 128 to conduct and pull the force output down toward the negative supply voltage VEE, while at the same time the positive clamp driver 136 would drive the pull-up transistor 126 to conduct and pull the force output up toward the positive supply voltage VCC. This causes a large current flow through pull-down transistor 128, diodes 132, 134, and pull-up transistor 126, effectively shorting VCC to VEE and causing significant damage to the PMU 100. Accordingly, avoidance of such a result would be advantageous.

Figure 2:
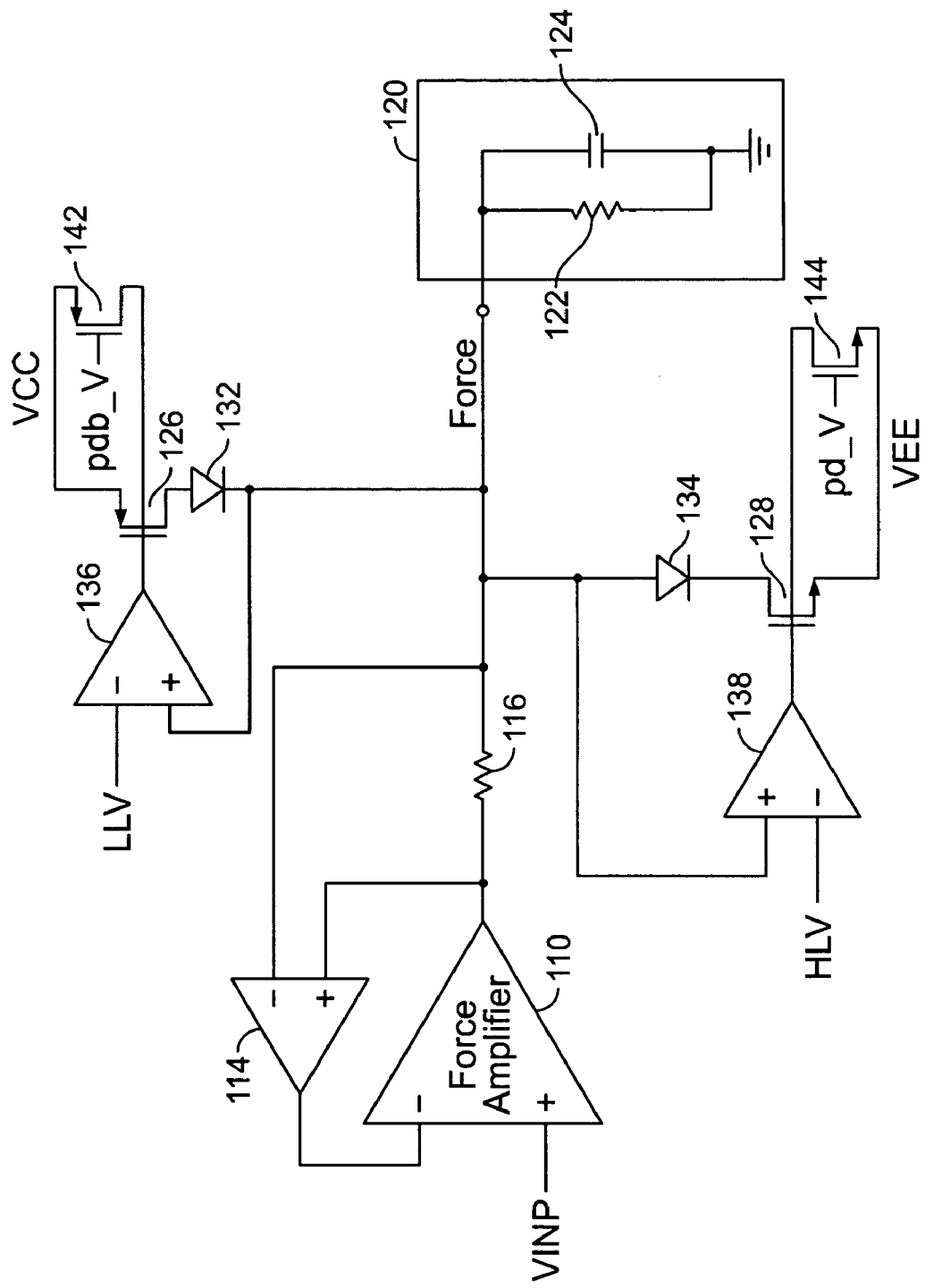
FIG. 2 is a schematic drawing of a PMU in accordance with an embodiment of the invention.

Referring now to FIG. 2, a precision measurement unit (PMU) is illustrated in accordance with an embodiment of the invention. The PMU is substantially as described above with respect to the FIG. 1, except for the addition of transistors 142, 144. Transistor 142 has source coupled to the positive supply voltage (VCC), drain coupled to the gate of pull-up transistor 126, and gate driven by a control signal (pdb_V). Transistor 144 has source coupled to the negative supply voltage (VEE), drain coupled to the gate of pull-down transistor 128, and gate driven by a control signal (pd_V). In the normal condition in which the high and low limit voltages HLV, LLV are programmed correctly, then the control signals pdb_V and pd_V will cause the transistors 142, 144 to remain in non-conductive states, thereby permitting the pull-up and pull-down transistors 126, 128 and respective clamp drivers 136, 138 to operate as intended. But, in the failure condition in which the high and low limit voltages HLV, LLV are programmed in reverse, then the control signals pdb_V and pd_V will cause the transistors 142, 144 to conduct and thereby hold the gates of the pull-up and pull-down transistors 126, 128 to VCC and VEE, respectively. This prevents the pull-up and pull-down transistors 126, 128 from conducting current to the force output.

Figure 3:
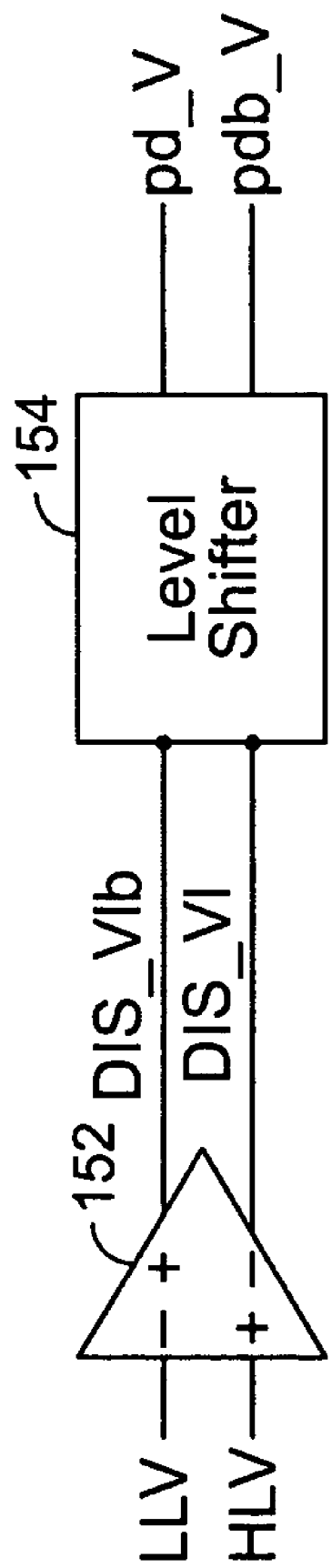
FIG. 3 is schematic drawing of an exemplary power down driver for use with the PMU of FIG. 2.

FIG. 3 illustrates an exemplary power down driver for generating the control signals pdb_V and pd_V. The driver detects whether a reversal of the high and low limit voltages HLV, LLV has occurred, and if so, provides control signals to the transistors 142, 144 to shut off the clamp circuits. The driver includes a comparator 152 and a level shifter 154. The non-inverting (+) input of the comparator 152 is coupled to the high limit voltage (HLV) and the inverting (−) input of the comparator is coupled to the low limit voltage (LLV). The comparator 152 produces a pair of inverse outputs DIS_VI and DIS_VIb. If HLV is greater than LLV, i.e., the normal operating condition, then output DIS_VI is low (e.g., −5 v) and output DIS_VIb is high (e.g., 15 v). Conversely, If HLV is less than LLV, i.e., the fault condition, then output DIS_VI is high (e.g., 15 v) and output DIS_VIb is low (e.g., −5 v).

The level shifter 154 converts the logical outputs DIS_VI and DIS_VIb to analog signals suitable for controlling the transistors 142, 144 (see FIG. 2), which in a preferred embodiment of the invention are provided by MOS devices. The level shifter 154 produces outputs pd_V and pdb_V corresponding to DIS_VI and DIS_VIb, respectively. If HLV is greater than LLV, i.e., the normal operating condition, then output pd_V is low (e.g., −5 v) and output pdb_V is high (e.g., 15 v). Conversely, If HLV is less than LLV, i.e., the fault condition, then outputs pd_V and pdb_V are each a mid level (e.g., 2 v). As known in the art, the MOS devices can only handle a maximum difference of 16 v from gate to source in order to prevent breakdown. In other embodiments utilizing other types of devices, it may be possible to avoid the use of the level shifter 154 altogether and use the outputs DIS_VI and DIS_VIb to control the transistors 142, 144 directly.

Figure 4:
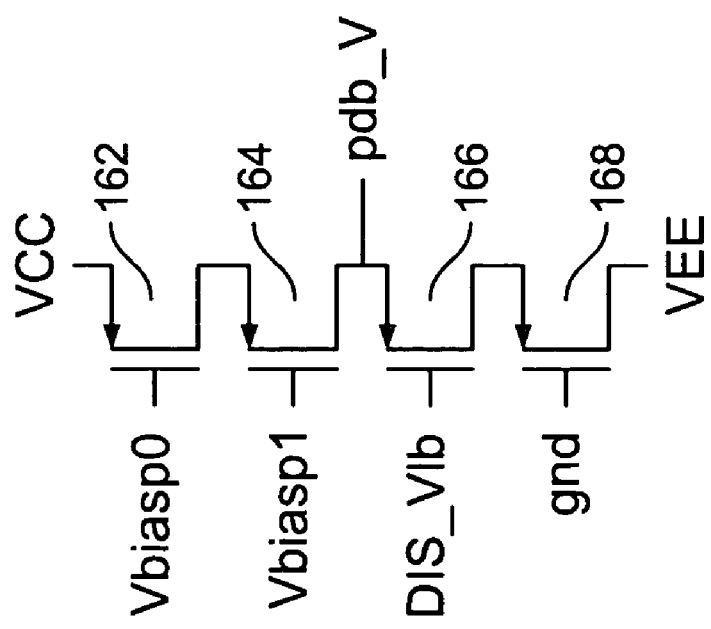
FIG. 4 is a schematic drawing of an exemplary high limit voltage (HLV) level shift circuit.

FIG. 4 illustrates an exemplary circuit in the level shifter 154 for converting DIS_VIb to pdb_V, including transistors 162, 164, 166, 168 coupled in series between VCC and VEE. Specifically, transistor 162 has source coupled to the positive supply voltage VCC, drain coupled to the source of transistor 164, and gate driven by a first bias signal (Vbiasp0); transistor 164 has drain coupled to the source of transistor 166, and gate driven by a second bias signal (Vbiasp1); transistor 166 has drain coupled to the source of transistor 168, and gate driven by comparator output DIS_VIb; and transistor 168 has drain coupled to the negative supply voltage VEE, and gate driven by ground. The output pdb_V is recovered from the common connection of the drain of transistor 164 and the source of transistor 166. By selecting appropriate values of the first and second bias signals (Vbiasp0 and Vbiasp1), such as by using a current mirror, the output signal pdb_V can be controlled such that it equals 15 v when DIS_VIb is 15 v, and 2 v when DIS_VIb is −5 v.

Figure 5:
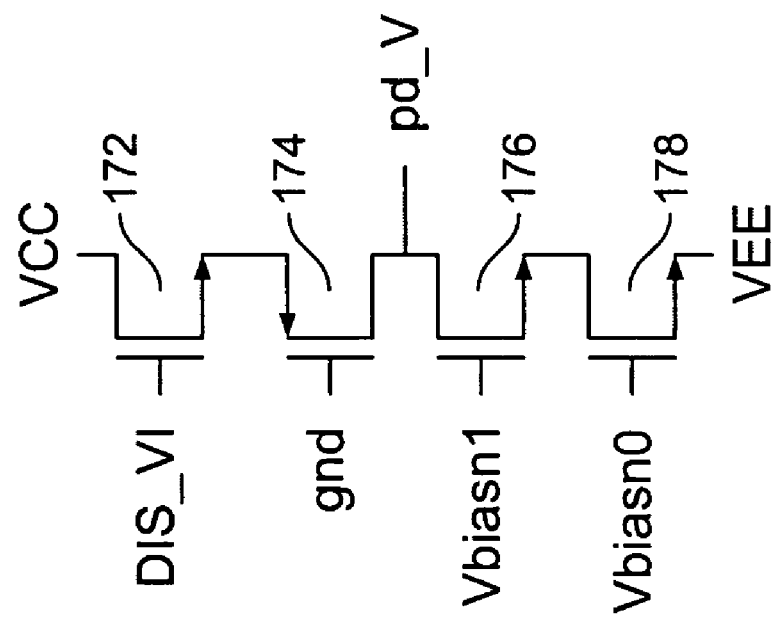
FIG. 5 is a schematic drawing of an exemplary low limit voltage (LLV) level shift circuit.

FIG. 5 illustrates an exemplary circuit in the level shifter 154 for converting DIS_VI to pd_V, including transistors 172, 174, 176, 178 coupled in series between VCC and VEE. Specifically, transistor 172 has drain coupled to the positive supply voltage VCC, source coupled to the drain of transistor 174, and gate driven by comparator output DIS_VI; transistor 174 has source coupled to the drain of transistor 176, and gate driven by ground; transistor 176 has source coupled to the drain of transistor 178, and gate driven by a second bias signal (Vbiasn1); and transistor 178 has source coupled to the negative supply voltage VEE, and gate driven by a first bias signal (Vbiasn0). The output pd_V is recovered from the common connection of the source of transistor 174 and the drain of transistor 176. By selecting appropriate values of the first and second bias signals (Vbiasn0 and Vbiasn1), such as by using a current mirror, the output signal pd_V can be controlled such that it equals 2 v when DIS_VI is 15 v, and −5 v when DIS_VI is −5 v. It should be appreciated that many alternative circuits could be utilized to provide level shifting of the comparator outputs (if necessary), and that the circuits of FIGS. 4 and 5 are presented merely for exemplary purposes.

Having thus described a preferred embodiment of a precision measurement unit having voltage and/or current clamps that power down upon inadvertent reversal of the clamp range settings, it should be apparent to those skilled in the art that certain advantages of the described invention have been achieved. It should also be appreciated that various modifications, adaptations, and alternative embodiments thereof may be made within the scope and spirit of the present invention. The invention is further defined by the following claims.

What is claimed is:

1. A precision measurement unit (PMU) having an output force terminal adapted to be coupled to a device under test, comprising:
    a force amplifier selectively providing either a forcing voltage or a forcing current to said device under test via said output force terminal;
    a low limit voltage clamp and a high limit voltage clamp operatively coupled to said output force terminal, said low and high limit voltage clamps each being responsive to user programming defining respective low and high voltage limits at said output force terminal; and
    means for disabling said low and high limit voltage clamps upon detection of a reversal of said user programming.

2. The precision measurement unit of claim 1, wherein said disabling means further comprises a comparator adapted to compare said low and high voltage limits and providing a disabling signal if said high voltage limit is lower than said low voltage limit.

3. The precision measurement unit of claim 2, wherein said disabling means further comprises a level shifter adapted to shift a voltage of said disabling signal to a level suitable for control of said low and high limit voltage clamps.

4. The precision measurement unit of claim 1, wherein said low limit voltage clamp further comprises a pull-up transistor operatively coupled between a positive voltage source and said output force terminal, said pull-up transistor being driven to conduction when a forcing voltage on said output force terminal equals said low voltage limit to thereby increase said forcing voltage.

5. The precision measurement unit of claim 4, wherein said disabling means further comprises a disabling transistor operatively coupled between said positive voltage source and a gate terminal of said pull-up transistor.

6. The precision measurement unit of claim 1, wherein said high limit voltage clamp further comprises a pull-down transistor operatively coupled between a negative voltage source and said output force terminal, said pull-down transistor being driven to conduction when a forcing voltage on said output force terminal equals said high voltage limit to thereby decrease said forcing voltage.

7. The precision measurement unit of claim 6, wherein said disabling means further comprises a disabling transistor operatively coupled between said negative voltage source and a gate terminal of said pull-down transistor.

8. A precision measurement unit (PMU) having an output force terminal adapted to be coupled to a device under test, comprising:
    a force amplifier selectively providing either a forcing voltage or a forcing current to said device under test via said output force terminal;
    a low limit voltage clamp including a pull-up transistor operatively coupled between a positive voltage source and said output force terminal, said pull-up transistor being driven to conduction when a forcing voltage on said output force terminal equals said low voltage limit to thereby increase said forcing voltage;
    a high limit voltage clamp including a pull-down transistor operatively coupled between a negative voltage source and said output force terminal, said pull-down transistor being driven to conduction when a forcing voltage on said output force terminal equals said high voltage limit to thereby decrease said forcing voltage, said low and high limit voltage clamps each being responsive to user programming defining respective low and high voltage limits at said output force terminal; and
    a comparator adapted to compare said low and high voltage limits and provide a disabling signal if said high voltage limit is lower than said low voltage limit, said disabling signal shutting off said pull-down transistor and said pull-up transistor.

9. The precision measurement unit of claim 8, wherein said disabling means further comprises a level shifter adapted to shift a voltage of said disabling signal to a level suitable for control of said pull-down transistor and said pull-up transistor.

10. A method for operating a precision measurement unit (PMU) having an output force terminal adapted to be coupled to a device under test, comprising:
    selectively providing either a forcing voltage or a forcing current to said device under test via said output force terminal;
    clamping voltage at said output force terminal to respective low and high voltage limits responsive to user programming; and
    disabling performance of said clamping step upon detection of a reversal of said user programming.

11. The method of claim 10, wherein said disabling step further comprises comparing said low and high voltage limits and providing a disabling signal if said high voltage limit is lower than said low voltage limit.

12. The method of claim 10, wherein said clamping step further comprises driving a pull-up transistor to conduction when a forcing voltage on said output force terminal equals said low voltage limit to thereby increase said forcing voltage.

13. The method of claim 10, wherein said clamping step further comprises driving a pull-down transistor to conduction when a forcing voltage on said output force terminal equals said high voltage limit to thereby decrease said forcing voltage.

* * * * *